(12) United States Patent
Huang et al.

(10) Patent No.: US 12,057,456 B2
(45) Date of Patent: Aug. 6, 2024

(54) ARRAY SUBSTRATE AND DISPLAY PANEL

(71) Applicant: TCL CHINA STAR OPTOELECTRONICS TECHNOLOGY CO., LTD., Guangdong (CN)

(72) Inventors: Lei Huang, Guangdong (CN); Shumin Tang, Guangdong (CN); Liu Yang, Guangdong (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 18/330,574

(22) Filed: Jun. 7, 2023

(65) Prior Publication Data

US 2024/0222392 A1    Jul. 4, 2024

(30) Foreign Application Priority Data

Dec. 31, 2022   (CN) .......................... 202211738739.3

(51) Int. Cl.
  *G02F 1/1343*   (2006.01)
  *G02F 1/1362*   (2006.01)
  (Continued)

(52) U.S. Cl.
  CPC .... *H01L 27/1244* (2013.01); *G02F 1/136218* (2021.01); *G02F 1/136222* (2021.01); *G02F 1/1368* (2013.01)

(58) Field of Classification Search
  CPC ............... H01L 27/124; H01L 27/1244; G02F 1/136218; G02F 1/136222;
  (Continued)

(56) References Cited

U.S. PATENT DOCUMENTS

2003/0128323 A1* 7/2003 Matsumoto ....... G02F 1/134363
                                                        349/141
2004/0263752 A1* 12/2004 Kim .................. G02F 1/134363
                                                        349/141

(Continued)

FOREIGN PATENT DOCUMENTS

JP        2009288665 A  * 12/2009
KR    20020073447 A  * 9/2002

*Primary Examiner* — Hoan C Nguyen
(74) *Attorney, Agent, or Firm* — PV IP PC; Zhigang Ma; Wei Te Chung (57) ABSTRACT

An array substrate and a display panel are provided by the present application. The array substrate includes a substrate, a thin film transistor (TFT) driving layer, a color filter layer, and a common electrode layer. The TFT driving layer includes at least two metal lines. A color filter opening of the color filter layer is provided with at least two openings separated. At least two electrode lines of the common electrode layer are electrically connected with the metal wires through the at least two openings. The array substrate further includes a pad layer located between the substrate and the color filter layer, and an orthographic projection of an inner edge of the color filter opening on the substrate falls within an orthographic projection of the pad layer on the substrate.

20 Claims, 5 Drawing Sheets

(51) Int. Cl.
*G02F 1/1368* (2006.01)
*H01L 27/12* (2006.01)

(58) Field of Classification Search
CPC ............. G02F 1/136227; G02F 1/1368; G02F 2001/1635; G02F 1/1676
See application file for complete search history.

(56) References Cited

U.S. PATENT DOCUMENTS

2005/0253978 A1* 11/2005 Chae ................. H01L 27/124
 349/43
2007/0242009 A1* 10/2007 Su ..................... G09G 3/3648
 345/87
2017/0163975 A1* 6/2017 Jin .................... G02B 30/28

* cited by examiner

ARRAY SUBSTRATE AND DISPLAY PANEL

FIELD OF INVENTION

The present application relates to a field of display technology, and particularly relates to an array substrate and a display panel.

BACKGROUND OF INVENTION

Color filter on array (COA) technology refers to a kind of technology that a color filter layer is manufactured on an array substrate to form a COA array substrate. A common electrode layer on the color filter layer includes electrode patterns insulated and arranged at intervals, which generally need to keep a safe distance between adjacent two electrode patterns to prevent a short. The electrode patterns are electrically connected with metal lines on the thin film transistor (TFT) driving layer by pixel via holes to realize signal transmission, resulting in an increase in a number of the pixel via holes.

Limited by a size of a pixel unit and an exposure process, at least two pixel via holes are generally disposed in one color filter opening. A terrain slit is disposed between the color filter opening and the pixel via holes. When manufacturing the electrode patterns, a photoresist is easy to deposit and form a thick film corresponding to an inner edge of the color filter opening, and may not be removed by exposure and development (that is, the photoresist may not be exposed incompletely), so that the electrode layer under the photoresist may not be removed by etching, and remains along the inner edge of the color filter opening, thereby easily leading to a short between the adjacent two electrode patterns and affecting a display effect.

Technical Problems

An array substrate and a display panel are provided by the present application to solve a technical problem that an electrode layer under a photoresist remains along an inner edge of a color filter opening, thereby easily leading to a short between adjacent two electrode patterns.

Technical Solutions

To solve the problem mentioned above, technical solutions provided by the present application are as follows:

An array substrate is provided by the present application, including:
- a substrate;
- a thin film transistor (TFT) driving layer, disposed on the substrate and including at least two metal lines;
- a color filter layer, disposed on the TFT driving layer and including a color filter opening, wherein the color filter opening is provided with at least two openings separated; and
- a common electrode layer, disposed on the color filter layer and including at least two electrode lines arranged at intervals and electrically connected with the metal wires through the at least two openings;
- wherein the array substrate further includes a pad layer located between the substrate and the color filter layer, and an orthographic projection of an inner edge of the color filter opening on the substrate falls within an orthographic projection of the pad layer on the substrate.

In an embodiment, the pad layer is disposed in a same layer as any one or more of the at least two metal lines in the TFT driving layer.

In an embodiment, the pad layer is formed by any one or more of the at least two metal lines disposed in the same layer as the pad layer and extends to an outside of the color filter opening.

In an embodiment, the at least two openings include a first opening and a second opening, the at least two metal lines include a first metal line and a second metal line, and the at least two electrode lines include a first electrode line and a second electrode line; the first electrode line is electrically connected with the first metal line through the first opening, and the second electrode line is electrically connected with the second metal line through the second opening; and
  wherein the pad layer includes a first pad part and a second pad part, the first pad part is formed by the first metal line extending along the outside of the color filter opening, and the second part is formed by the second metal line extending along the outside of the color filter opening.

In an embodiment, the first metal line and the second metal line are disposed in a same layer.

In an embodiment, the first metal line and the second metal line are disposed in different layers.

In an embodiment, the TFT driving layer includes a thin film transistor including a gate electrode, a source electrode, and a drain electrode;
  the first metal layer includes a scanning line, the gate electrode, and a common electrode line arranged at intervals, and the second metal layer is insulated and disposed on the first metal layer and includes a data line, a source electrode, and a drain electrode; and
  the first electrode line includes a shielding electrode line electrically connected with the common electrode line through the first opening, and the second electrode line includes a pixel electrode electrically connected with the drain electrode through the second opening In an embodiment, the common electrode layer further includes a connecting line configured to connect two shielding electrode lines located at two sides of the pixel electrode, and the connecting line is at least partially located within the color filter opening; and
  wherein the first pad part and the second pad part are located between the connecting line and the pixel electrode.

In an embodiment, the first pad part and the second pad part are parallel to the scanning line.

In an embodiment, the first pad part extends to a side away from the thin film transistor, and the second pad part extends to a side adjacent to the thin film transistor.

In an embodiment, further including an auxiliary electrode layer disposed between the color filter layer and the common electrode layer;
  wherein the auxiliary electrode layer includes an auxiliary electrode line, and an orthographic projection of the auxiliary electrode line and the shielding electrode lines on the substrate overlaps an orthographic projection of the data line on the substrate.

In an embodiment, the first opening includes a first sub opening and a second sub opening communicated, and the second sub opening is located at an end of the first sub opening away from the substrate; the auxiliary electrode line is electrically connected with the shielding electrode line through the second sub opening, and the shielding electrode line is electrically connected with the common electrode line through the first sub opening.

In an embodiment, the color filter opening includes a slit part between an edge of the color filter opening and the at least two openings, and an orthographic projection of the slit part on the substrate falls within an orthographic projection of the pad layer on the substrate.

A display panel is provided by the present application, including:
an array substrate;
an opposite substrate, disposed opposite to the array substrate; and
a liquid crystal layer, disposed between the array substrate and the opposite substrate;
wherein the array substrate includes:
a substrate;
a TFT (thin film transistor) driving layer, disposed on the substrate and including at least two metal lines;
a color filter layer, disposed on the TFT driving layer and including a color filter opening, wherein the color filter opening is provided with at least two openings separated; and
a common electrode layer, disposed on the color filter layer and including two or more electrode lines arranged at intervals and electrically connected with the metal wires through the at least two openings;
wherein the array substrate further includes a pad layer located between the substrate and the color filter layer, and an orthographic projection of an inner edge of the color filter opening on the substrate falls within an orthographic projection of the pad layer on the substrate.

In an embodiment, the pad layer is disposed in a same layer as any one or more of the at least two metal lines in the TFT driving layer.

In an embodiment, the pad layer is formed by any one or more of the at least two metal lines disposed in the same layer as the pad layer and extends to an outside of the color filter opening.

In an embodiment, the at least two openings include a first opening and a second opening, the at least two metal lines include a first metal line and a second metal line, and the at least two electrode lines include a first electrode line and a second electrode line; the first electrode line is electrically connected with the first metal line through the first opening, and the second electrode line is electrically connected with the second metal line through the second opening; and
wherein the pad layer includes a first pad part and a second pad part, the first pad part is formed by the first metal line extending along the outside of the color filter opening, and the second part is formed by the second metal line extending along the outside of the color filter opening.

In an embodiment, the first metal line and the second metal line are disposed in a same layer.

In an embodiment, the first metal line and the second metal line are disposed in different layers.

In an embodiment, the TFT driving layer includes a thin film transistor including a gate electrode, a source electrode, and a drain electrode;
the first metal layer includes a scanning line, the gate electrode, and a common electrode line arranged at intervals, and the second metal layer is insulated disposed on the first metal layer and includes a data line, a source electrode, and a drain electrode; and
the first electrode line includes a shielding electrode line electrically connected with the common electrode line through the first opening, and the second electrode line includes a pixel electrode electrically connected with the drain electrode through the second opening.

Beneficial Effects

In an array substrate and a display panel provided by the present application, a pad layer is disposed between a substrate and a color filter layer, and an orthographic projection of an inner edge of the color filter opening on the substrate falls within an orthographic projection of the pad layer on the substrate, so that a terrain difference of the inner edge of the color filter opening is reduced. When manufacturing electrode patterns of a common electrode layer on the color filter layer, a film thickness of a photoresist formed by depositing and corresponding to the inner edge of the color filter opening is reduced. The electrode layer under the photoresist is etched completely by utilizing the terrain difference, so that the electrode layer that may remain along the inner edge of the color filter opening is cut off, an etching residue problem is solved, and preventing a short connection between two or more via signals in one same color filter opening, which is beneficial to improving a display effect.

DESCRIPTION OF DRAWINGS

To describe technical solutions of embodiments of the present application more clearly, the following briefly introduces accompanying drawings used in the description of the embodiments of the present application. The accompanying drawings described below illustrate only some exemplary embodiments of the present application, and persons skilled in the art may derive other drawings from the drawings without making creative efforts.

REFERENCE NUMERALS 1, array substrate; 2, opposite substrate; 3, liquid crystal layer;
1a, pixel area; 1b, data line area; 1c, scanning line area;
10, substrate; 11, thin film transistor (TFT) driving layer; 11a, thin film transistor; ML1, a first metal line; ML2, a second metal line; 12, color filter layer; 121, color filter opening; 1211, first opening; 1211a, first sub opening; 1211b, second sub opening; 1212, second opening; 122, slit part; 13, common electrode layer; CL1, first electrode line; CL2, second electrode line;

131, shielding electrode line; 132, pixel electrode; 14, pad layer; 141, first pad part; 142, second pad part; 110, first metal layer; 1101, gate electrode; 1102, scanning line; 1103, common electrode line; 111, gate insulating layer; 112, second metal layer; 1121, data line; 1122, source electrode; 1123, drain electrode; 113, first insulating layer; 114, second insulating layer; 115, auxiliary electrode layer; 1151, auxiliary electrode line; D1, first direction; D2, second direction.

DETAILED DESCRIPTION OF EMBODIMENTS

The technical solutions in the embodiments of the present application will be described clearly and completely hereafter with reference to the accompanying drawings. Apparently, the described embodiments are merely a part of but not all embodiments of the present application. All other embodiments obtained by persons of ordinary skill in the art based on the embodiments of the present application without creative efforts shall fall within the protection scope of the present application. In addition, it should be understood that specific embodiments described herein are merely for explaining the present application, the term "embodiment" used in a context means an example, instance, or illustration, and the present application is not limited thereto. In the present application, location terms such as "up" and "down" are used in general to refer to up and down in actual use or operation of a device, in particular drawing directions in the drawings, without description to the contrary. While "inside" and "outside" are for the outline of the device.

Referring to FIG. 1 to FIG. 5, an array substrate 1 is provided by the present application including a substrate 10, a thin film transistor (TFT) driving layer 11, a color filter layer 12, and a common electrode layer 13. The TFT driving layer 11 is disposed on the substrate 10 and includes at least two metal lines ML. The color filter layer 12 is disposed on the TFT driving layer 11 and includes a plurality of color filter openings 121. Each color filter opening 121 is provided with at least two openings separated. A common electrode layer 13 is disposed on the color filter layer 12 and includes at least two electrode lines arranged at intervals and electrically connected with the metal wires ML through the at least two openings.

The array substrate 1 further includes a pad layer 14 located between the substrate 10 and the color filter layer 12. An orthographic projection of an inner edge of the color filter opening 121 on the substrate 10 falls within an orthographic projection of the pad layer 14 on the substrate 10, so that a terrain difference of the inner edge of the color filter opening 121 is reduced. When manufacturing electrode patterns of the common electrode layer 13 on the color filter layer 12, a film thickness of a photoresist formed by depositing and corresponding to the inner edge of the color filter opening 121 is reduced. The electrode layer under the photoresist is etched completely by utilizing the terrain difference, so that the electrode layer that may remain along the inner edge of the color filter opening 121 is cut off, an etching residue problem is solved, and preventing a short connection between two or more via signals in one same color filter opening 121, which is beneficial to improving a display effect.

In this embodiment, the pad layer 14 is disposed in the TFT driving layer 11. Optionally, the pad layer 14 may further be disposed between the substrate 10 and the color filter layer 12 except other film layers of the TFT driving layer 11.

Optionally, the substrate 10 may be a glass substrate, a rigid plastic substrate, or a flexible plastic substrate. The substrate 10 is transparent through which light may penetrate. A buffer layer may or may not be disposed between the TFT driving layer 11 and the substrate 10.

Figure 5:
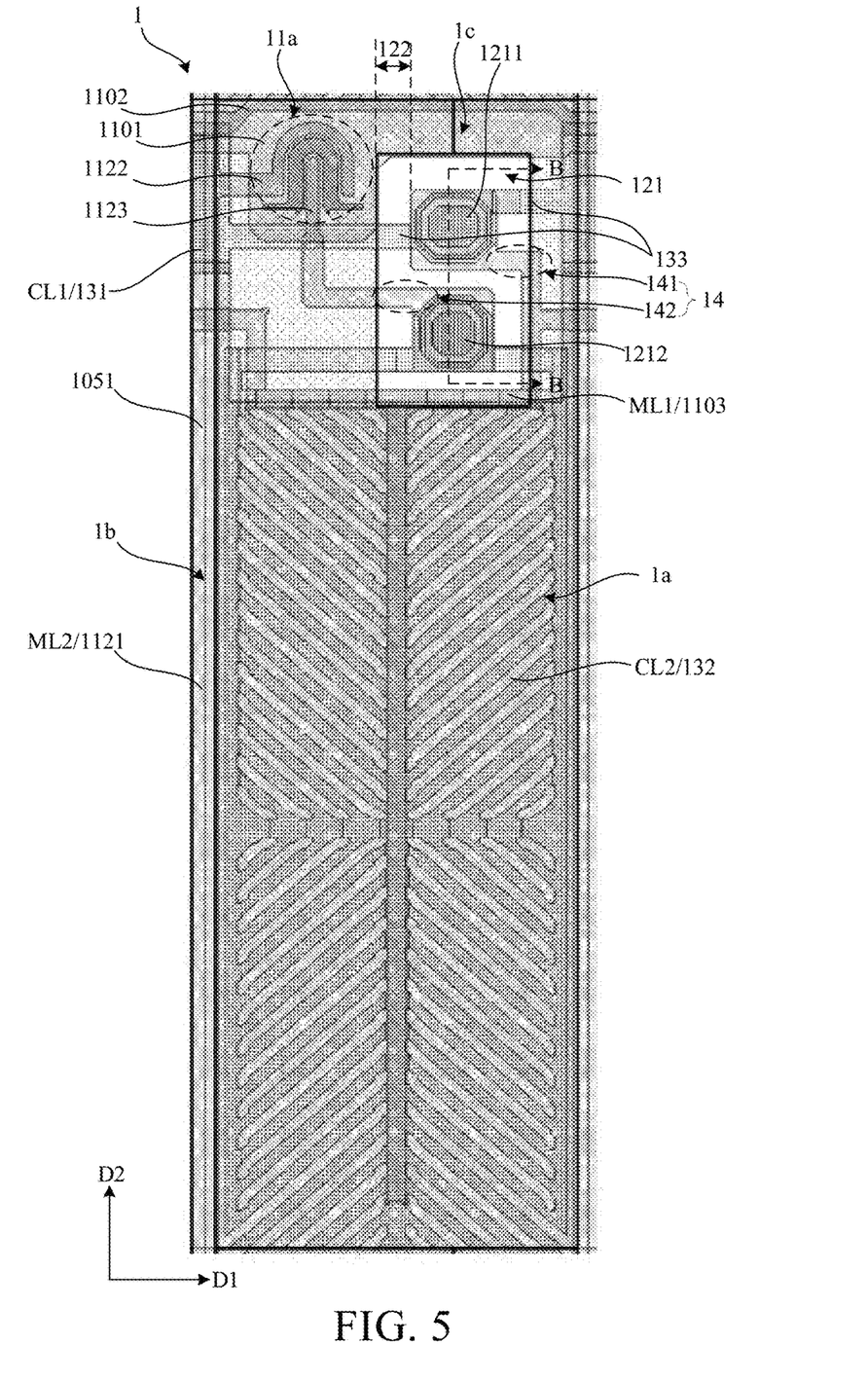
FIG. 5 is another top-view schematic diagram of an array substrate provided by an embodiment of the present application.

Referring to FIG. 5, a plurality of thin film transistors 11a and a plurality of signal lines are disposed on the TFT driving layer 11. Each of the plurality of thin film transistors 11a includes a gate electrode 1101, a source electrode 1122, and a drain electrode 1123. Each of the plurality of signal lines includes a scanning line 1102, a data line 1121, and a common electrode line 1103. The scanning line 1102, the gate electrode 1101, and the common electrode line 1103 are disposed in a same layer, which may be defined as a first metal layer 110. The source electrode 1122, the drain electrode 1123, and the data line 1121 are disposed in a same layer, which may be defined as a second metal layer 112 located and insulated on a side of the first metal layer 110 away from the substrate 10.

Figure 1:
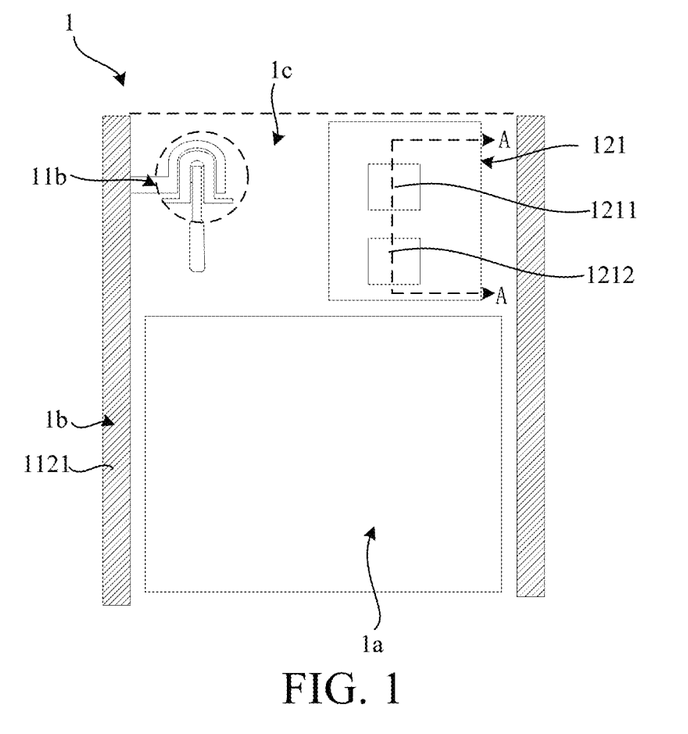
FIG. 1 is a top-view schematic diagram of an array substrate provided by an embodiment of the present application.

Referring to FIG. 1, the array substrate 1 includes a pixel area 1a, a data line area 1b, and a scanning line area 1c. The pixel electrode 132 is disposed in the pixel area 1a, the data line 1121 is disposed in the data line area 1b, and the scanning line 1102 and the thin film transistor 11a are disposed in the scanning line area 1c. The color filter opening 121 is also located in the scanning line area 1c. In a top view, the data line area 1b and the pixel area 1a are disposed adjacent to each other in a first direction D1, the scanning line area 1c and the pixel area 1a are disposed adjacent to each other in a second direction D2, and the scanning line area 1c and the pixel area 1a are located on a side of the data line area 1b. It should be noted that the first direction D1 is perpendicular to the second direction D2, the first direction D1 is an extending direction of the scanning line 1102, the second direction D2 is an extending direction of the data line 1121, and the scanning line 1102 and the data line 1121 intersect to define the pixel area 1a.

In this embodiment, it should be noted that any one of the at least two metal lines may be located either in the first metal layer 110 or the second metal layer 112, or may be located in neither the first metal layer 110 nor the second metal layer 112. That is, any one of the at least two metal lines may be located in other metal film layers except the first metal layer 110 and the second metal layer 112, which is not limited in the embodiment of the present application.

Optionally, the color filter layer 12 includes a plurality of red color filters, a plurality of green color filters, and a plurality of blue color filters. Each color filter opening 121 is a large opening and has a square shape in the top view. Optionally, the color filter opening 121 has a rectangular shape.

In this embodiment, the pad layer 14 is disposed in a same layer as any one or more of the at least two metal lines in the TFT driving layer 11. The pad layer 14 may be formed in one same process as the at least two metal lines, which is beneficial to saving the process. Optionally, the pad layer 14 may also be disposed in a different layer from either of the at least two metal lines, and may be film layers other than the first metal layer 110 and the second metal layer 112 in the TFT driving layer 11.

Furthermore, the pad layer 14 is formed by any one or more of the at least two metal lines disposed in the same layer as the pad layer 14 and extends to an outside of the color filter opening 121. That is, the pad layer 14 is disposed in the same layer as the metal lines in the TFT driving layer 11, and the pad layer 14 may be formed by the same process as the metal lines without adding a new process for forming the pad layer 14, which is beneficial to saving the process and reducing production cost. In addition, it is beneficial to reduce a thickness of the array substrate 1, which conforms to a thinning trend.

In this embodiment, a material of the pad layer 14 is a metal material. On one hand, the pad layer 14 may be used to play a pad role, so that the photoresist at the inner edge of the color filter is completely removed, and the electrode layer at the inner edge of the color filter is completely etched. On another hand, since the metal material has reflective properties, an exposure effect may be improved by the pad layer 14, so that the photoresist coated on the inner edge of the color filter is completely exposed and removed by development.

In order to clearly describe the technical solutions provided by the present application, this embodiment is illustrated with an example that the at least two openings include two openings, the at least two metal lines include two metal lines, the two metal lines are located in either one or two of the first metal layer 110 or the second metal layer 112, and the at least two electrode lines include two electrode lines.

Specifically, the at least two openings include a first opening 1211 and a second opening 1212. The at least two metal lines include a first metal line ML1 and a second metal line ML2. The at least two electrode lines include a first electrode line CL1 and a second electrode line CL2. The first electrode line CL1 is electrically connected with the first metal line ML1 through the first opening 1211, and the second electrode line CL2 is electrically connected with the second metal line ML2 through the second opening 1212. The pad layer 14 includes a first pad part 141 formed by the first metal line ML1 extending along the outside of the color filter opening 121, and the second part 142 is formed by the second metal line ML2 extending along the outside of the color filter opening 121.

Figure 2:
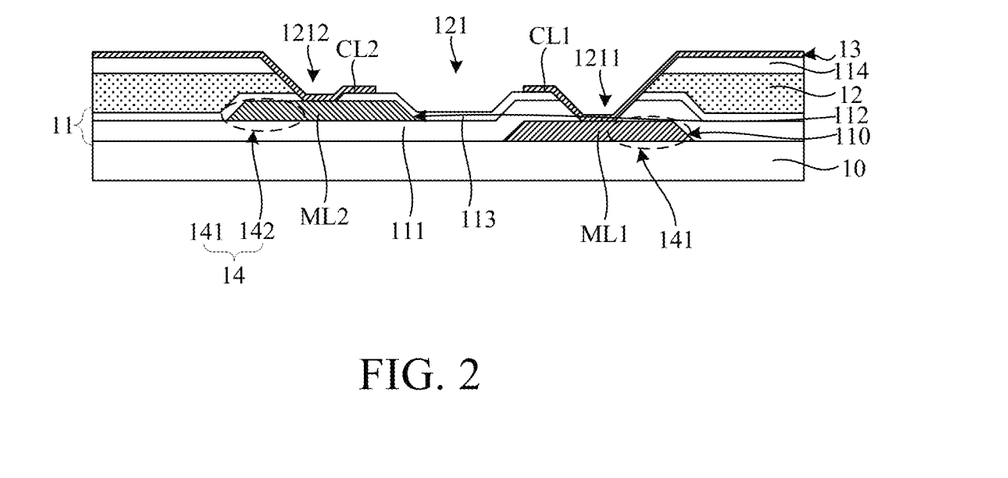
FIG. 2 is a first cross-sectional schematic diagram of the array substrate of FIG. 1 along a direction A-A.

In an embodiment, the first metal line ML1 and the second metal line ML2 are disposed in different layers. Specifically, as shown in FIG. 2, the first metal line ML1 is located in the first metal layer 110, and the second metal line ML2 is located in the second metal layer 112. Or, the first metal line ML1 is located in the second metal layer 112, and the second metal line ML2 is located in the first metal layer 110.

Figure 3:
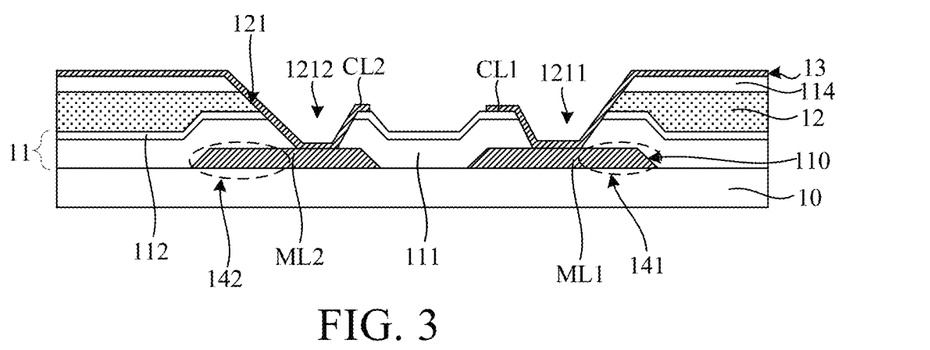
FIG. 3 is a second cross-sectional schematic diagram of the array substrate of FIG. 2 along the direction A-A.
Figure 4:
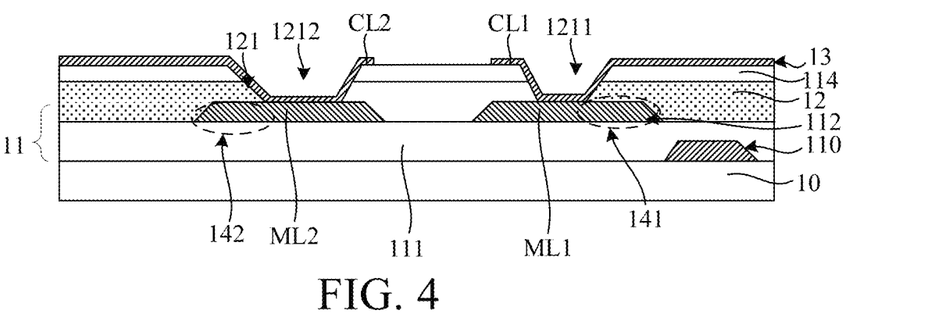
FIG. 4 is a third cross-sectional schematic diagram of the array substrate of FIG. 2 along the direction A-A.

In an embodiment, as shown in FIG. 3 and FIG. 4, the first metal line ML1 and the second metal line ML2 are disposed in the same layer. Specifically, as shown in FIG. 3, both the first metal line ML1 and the second metal line ML2 may be located in the first metal layer 110. As shown in FIG. 4, both the first metal line ML1 and the second metal line ML2 may be located in the second metal layer 112.

In order to clearly describe the technical solutions provided by the present application, taking the first metal line ML1 and the second metal line ML2 are disposed in different layers as an example. However, it should be noted that the embodiment of the present application is merely an example, and the case where the first metal line ML1 and the second metal line ML2 are disposed in the same layer is also within a protection scope of the present application.

Figure 6:
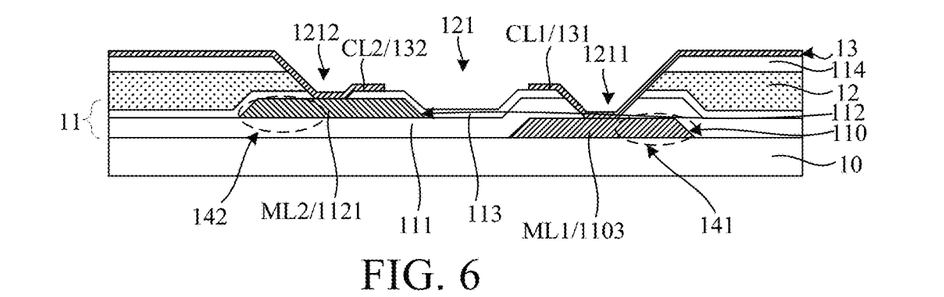
FIG. 6 is a cross-sectional schematic diagram of the array substrate of FIG. 5 along a direction B-B.

Referring to FIG. 5 and FIG. 6, the first metal line ML1 includes the scanning line 1102, the gate electrode 1101, and the common electrode line arranged at intervals. The second metal line ML2 is disposed on the first metal line ML1 and includes the data line 1121, the source electrode 1122, and the drain electrode 1123. The first electrode line CL1 includes a shielding electrode line 131 electrically connected with the common electrode line 1103 through the first opening 1211. The second electrode line CL2 includes a pixel electrode 132 electrically connected with the drain electrode 1123 through the second opening 1212.

It should be noted that the shielding electrode line 131 in this embodiment is configured to shield the data line 1121 instead of a black matrix of a color film shielding principle of the shielding electrode line 131 by controlling a potential of liquid crystals is as follows:

The shielding electrode line 131 and a CF common electrode of the color film (CF) substrate located opposite from the array substrate 1 are applied a same common potential, and there is no voltage difference between them, so that the liquid crystals sandwiched between the shielding electrode line 131 and the CF common electrode do not rotate regardless of what voltage signal is applied to the pixel electrode 132. If the liquid crystals do not rotate, a phase of polarized light does not change. In a liquid crystal display with normal black mode, the polarized light passing through a first polarizer may not pass through a second polarizer above the first polarizer, so the shielding electrode line 131 may play a role equivalent to the black matrix, so as to replace the black matrix for shielding light. Furthermore, the shielding electrode line 131 is located on the array substrate 1, and when the display panel is curved to form a curved display, even if an upper substrate or a lower substrate is dislocated, a position of the shielding electrode line 131 relative to the data line 1121 may not be changed, thereby preventing a light leakage problem and mura (poor display).

In this embodiment, the common electrode layer 13 further includes a connecting line 133 configured to connect two shielding electrode lines 131 located on both sides of the pixel electrode 132 across lines, and the connecting line 133 is at least partially located in the color filter opening 121. The connecting line 133 is disposed in a same layer as the pixel electrode 132 and the shielding electrode line 131, which are formed by one same process. Specific an arrangement of the connecting lines 133 is not limited by the present application, so long as the shielding electrode lines 131 are effectively turned on without interfering with other lines.

In this embodiment, the first pad part 141 and the second pad part 142 are located between the connecting line 133 and the pixel electrode 132. In the top view, the pixel electrode 132 is located below the color filter opening 121. One end of the connecting line 133 is connected with one of the shielding electrode lines 131, and another end of the connecting line 133 sequentially crosses a left side and a right side of the color filter opening 121. Optionally, the first pad part 141 and the second pad part 142 are respectively located at the left side and the right side of the color filter opening 121. Specifically, the first pad part 141 is located at the right side of the color filter opening 121, and the second pad part 142 is located at the left side of the color filter opening 121. Optionally, the left side and the right side of the color filter opening 121 may be parallel to the data line 1121.

It may be understood that the terrain at the position where the first pad part 141 is provided on the right side of the color filter opening 121 is raised, and a terrain difference is reduced, thereby reducing a film thickness formed by the photoresist deposited at this position, and the electrode layer at this position are etched completely, so that the electrode layer formed at the inner edge of the color filter opening 121 are cut off, and the connecting lines 133 located above and below the first pad part 141 and the pixel electrode 132 may not be contacted, thereby preventing the short circuit.

Similarly, the terrain at the position where the second pad part 142 is provided on the left side of the color filter opening 121 is raised, and a terrain difference is reduced, thereby reducing a film thickness formed by the photoresist deposited at this position, and the electrode layer at this position is etched completely, so that the electrode layer formed at the inner edge of the color filter opening 121 are cut off, and the connecting lines 133 located above and below the second pad part 142 and the pixel electrode 132 may not be contacted, thereby preventing the short circuit.

Optionally, one first pad part 141 and one second pad part 142 may be provided, and a plurality of first pad parts 141 and a plurality of second pad parts 142 may also be provided, which is not limited by this embodiment.

In this embodiment, the first pad part 141 and the second pad part 142 may be parallel to the scanning line 1102, which is beneficial to optimizing wirings within the color filter opening 121. Specifically, the first pad part 141 extends to a side away from the thin film transistor 11*a* to a side of the color filter opening 121, and the second pad 142 extends to a side adjacent to the thin film transistor 11*a* to another side of the color filter opening 121.

Specifically, the TFT driving layer 11 further includes a gate insulating layer 111 covering the first metal layer 110 and an active layer disposed between the gate insulating layer 111 and the second metal layer 112. The array substrate 1 further includes a first insulating layer 113 covering the color filter layer 12 and a second insulating layer 114 between the color filter layer 12 and the common electrode layer 13. The arrangement of the pad layer 14 is equivalent to padding a terrain of the second insulating layer 114.

In this embodiment, the array substrate 1 further includes an auxiliary electrode layer 115 disposed between the color filter layer 12 and the common electrode layer 13. The auxiliary electrode layer 115 includes an auxiliary electrode line 1151. An orthographic projection of the auxiliary electrode line 1151 and the shielding electrode line 131 on the substrate 10 overlaps an orthographic projection of the data line 1121 on the substrate 10.

It may be understood that an electrode line configured to shield the data line 1121 consists of the shielding electrode line 131 and the auxiliary electrode line 1151, which are disposed in different layers. The auxiliary electrode line 1151 is at least located on one side of the pixel region 1*a*, and the auxiliary electrode line 1151 is transparent and disposed in different layers from the pixel electrode 132. Therefore, there is no gap restriction between the auxiliary electrode line 1151 and the pixel electrode 132, so that a light-emitting area of the pixel region 1*a* may be increased and a penetration rate may be improved. Since the pixel electrode 132 is not provided in the scanning line area 1*c* while the penetration rate is taken into account, a main electrode line disposed in the same layer as the pixel electrode 132 is disposed at one side of the scanning line area 1*c*, which is beneficial to reducing a parasitic capacitance between the data line 1121 and the auxiliary electrode line 1151, improving a charging efficiency, reducing a power of the data line 1121, and improving a serious heating problem of a flip-chip film.

Figure 7:
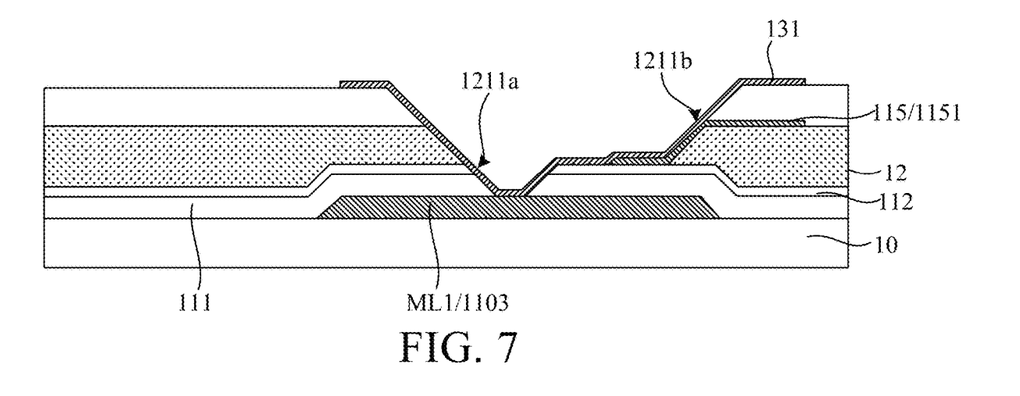
FIG. 7 is another cross-sectional schematic diagram of the array substrate of FIG. 5 along the direction B-B.

Referring to FIG. 7, the first opening 1211 includes a first sub opening 1211*a* and a second sub opening 1211*b* communicated. The second sub opening 1211*b* is located at an end of the first sub opening 1211*a* away from the substrate. The auxiliary electrode line 1151 is electrically connected with the shielding electrode line 131 through the second sub opening 1211*b*, and the shielding electrode line 131 is electrically connected with the common electrode line 1103 through the first sub opening 1211*b*, so that the auxiliary electrode line 1151 has the same potential as the shielding electrode line 131, and the shielding electrode line 131 has the same potential as the common electrode line 1103. In other words, the auxiliary electrode line 1151 has the same potential as the common electrode line 1103 and may have a function of shielding the data line 1121. Compared with a way in which the auxiliary electrode line 1151 is connected with an external signal, a surface resistance of the auxiliary electrode line 1151 is greater than a surface resistance of metals (copper and aluminum), which is beneficial to improving a uniformity of signal distribution in a surface of the auxiliary electrode line 1151 and improving an integration level of the array substrate 1.

Optionally, in other embodiments, the color filter opening 121 may further include the first sub-opening 1211*a* and the second sub-opening 1211*b* which are separately disposed. The auxiliary electrode line 1151 is electrically connected to the common electrode line 1103 through the first sub-opening 1211*a*, and the shielding electrode line 131 is electrically connected to the common electrode line 1103 through the second sub-opening 1211*b*.

In this embodiment, the color filter opening 121 includes a slit part 122 located between the edge of the color filter opening 121 and the opening. An orthographic projection of the slit part 122 on the substrate 10 falls within the orthographic projection of the pad layer 14 on the substrate 10, so that the electrode layer at the position between the edge of the color filter opening 121 and the opening are completely etched, which is beneficial to further reducing a risk of short circuit between the electrodes in the same layer.

Figure 8:
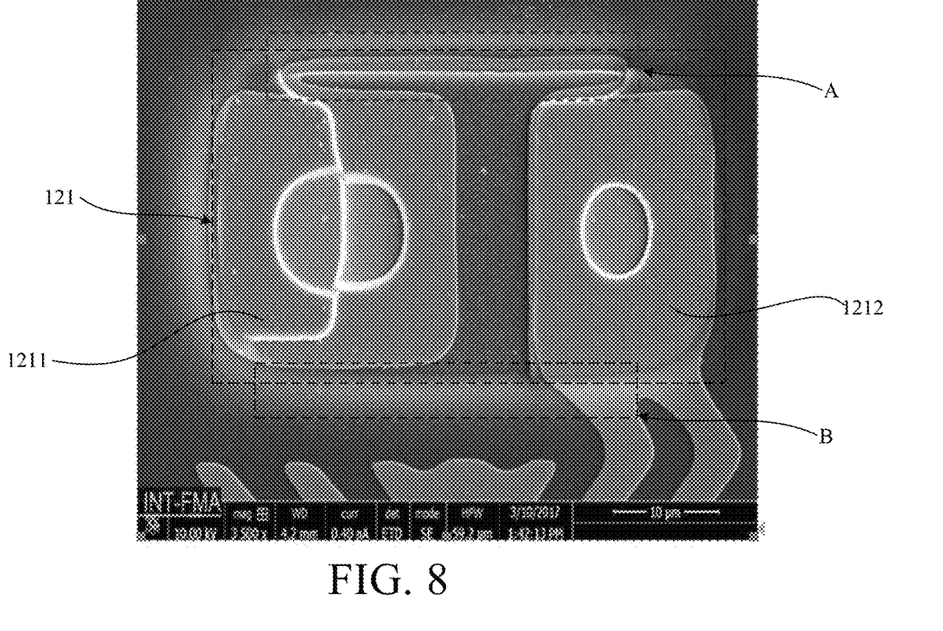
FIG. 8 is an experimental verification diagram of electrode residue at an inner edge of a color filter opening provided by an embodiment of the present application.

Referring to FIG. 8, the inventor has experimentally verified the technical solutions provided by the present application. An upper edge of the color filter opening 121 is not provided with the pad layer 14, and a lower edge of the color filter opening 121 is provided with the pad layer 14. As can be seen from the figure, the upper edge of the color filter opening 121 has electrode residue, and the electrodes on the first opening 1211 and the second opening 1212 in the color filter opening 121 contact at an upper part and short-circuit, but do not contact at a lower part and do not short-circuit. Therefore, it may be verified that the technical solutions provided by the present application have a technical effect of preventing electrode etching residue.

Figure 9:
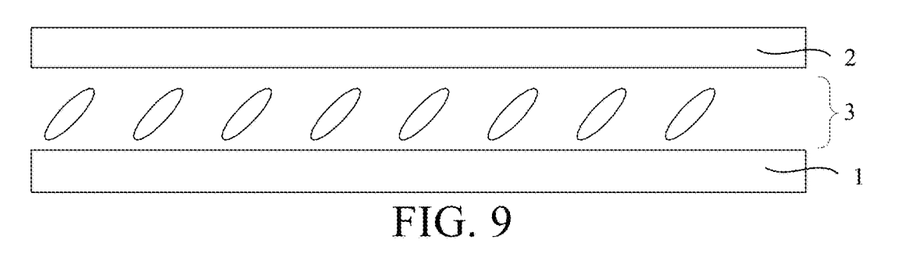
FIG. 9 is a cross-sectional schematic diagram of a display panel provided by an embodiment of the present application.

Referring to FIG. 9, the embodiment of the present application further provides a display panel, which is a liquid crystal display panel. The display panel includes the array substrate 1 in the embodiments mentioned above, an opposite substrate 2 disposed opposite to the array substrate 1, and a liquid crystal layer 3 disposed between the array substrate 1 and the opposite substrate 2.

Specifically, the opposite substrate 2 is the color film substrate. A CF common electrode is disposed on the opposite substrate 2. There is a voltage difference between the CF common electrode and the pixel electrode 132 on the array substrate 1, which may drive liquid crystal molecules in the liquid crystal layer 3 to rotate to realize screen display. The black matrix is further disposed on the opposite substrate 2, certainly, the black matrix may also be disposed on the array substrate 1.

Beneficial effects are: in the array substrate and the display panel provided by the present application, the pad layer is disposed between the substrate and the color filter layer, and the orthographic projection of the inner edge of the color filter opening on the substrate falls within the orthographic projection of the pad layer on the substrate, so that the terrain difference of the inner edge of the color filter opening is reduced. When manufacturing electrode patterns of the common electrode layer on the color filter layer, the film thickness of the photoresist formed by depositing and corresponding to the inner edge of the color filter opening is reduced. The electrode layer under the photoresist is etched completely by utilizing the terrain difference, so that the electrode layer that may remain along the inner edge of the color filter opening is cut off, the etching residue problem is solved, and preventing the short connection between two or more via signals in one same color filter opening, which is beneficial to improving a display effect.

The description about the foregoing embodiments is merely provided to help understand the method and core ideas of the present application. Persons of ordinary skill in the art should understand that they may still make modifications to the technical solutions described in the foregoing embodiments or make equivalent replacements to some or all technical features thereof, without departing from the scope of the technical solutions of the embodiments of the present application.

What is claimed is:

1. An array substrate, comprising:
   a substrate;
   a thin film transistor (TFT) driving layer, disposed on the substrate and comprising at least two metal lines;
   a color filter layer, disposed on the TFT driving layer and comprising a color filter opening, wherein the color filter opening is provided with at least two openings separated; and
   a common electrode layer, disposed on the color filter layer and comprising at least two electrode lines arranged at intervals and electrically connected with the metal wires through the at least two openings;
   wherein the array substrate further comprises a pad layer located between the substrate and the color filter layer, and an orthographic projection of an inner edge of the color filter opening on the substrate falls within an orthographic projection of the pad layer on the substrate.

2. The array substrate according to claim 1, wherein the pad layer is disposed in a same layer as any one or more of the at least two metal lines in the TFT driving layer.

3. The array substrate according to claim 2, wherein the pad layer is formed by any one or more of the at least two metal lines disposed in the same layer as the pad layer and extends to an outside of the color filter opening.

4. The array substrate according to claim 3, wherein the at least two openings comprise a first opening and a second opening, the at least two metal lines comprise a first metal line and a second metal line, and the at least two electrode lines comprise a first electrode line and a second electrode line; the first electrode line is electrically connected with the first metal line through the first opening, and the second electrode line is electrically connected with the second metal line through the second opening; and
   wherein the pad layer comprises a first pad part and a second pad part, the first pad part is formed by the first metal line extending along the outside of the color filter opening, and the second part is formed by the second metal line extending along the outside of the color filter opening.

5. The array substrate according to claim 4, wherein the first metal line and the second metal line are disposed in a same layer.

6. The array substrate according to claim 5, wherein the first metal line and the second metal line are disposed in different layers.

7. The array substrate according to claim 6, wherein the TFT driving layer comprises a thin film transistor comprising a gate electrode, a source electrode, and a drain electrode;
   the first metal layer includes a scanning line, the gate electrode, and a common electrode line arranged at intervals, and the second metal layer is insulated and disposed on the first metal layer and comprises a data line, a source electrode, and a drain electrode; and
   the first electrode line comprises a shielding electrode line electrically connected with the common electrode line through the first opening, and the second electrode line comprises a pixel electrode electrically connected with the drain electrode through the second opening.

8. The array substrate according to claim 7, wherein the common electrode layer further comprises a connecting line configured to connect two shielding electrode lines located at two sides of the pixel electrode, and the connecting line is at least partially located within the color filter opening; and
   wherein the first pad part and the second pad part are located between the connecting line and the pixel electrode.

9. The array substrate according to claim 7, wherein the first pad part and the second pad part are parallel to the scanning line.

10. The array substrate according to claim 9, wherein the first pad part extends to a side away from the thin film transistor, and the second pad part extends to a side adjacent to the thin film transistor.

11. The array substrate according to claim 7, further comprising an auxiliary electrode layer disposed between the color filter layer and the common electrode layer;
    wherein the auxiliary electrode layer comprises an auxiliary electrode line, and an orthographic projection of the auxiliary electrode line and the shielding electrode lines on the substrate overlaps an orthographic projection of the data line on the substrate.

12. The array substrate according to claim 11, wherein the first opening comprises a first sub opening and a second sub opening communicated, and the second sub opening is located at an end of the first sub opening away from the substrate; the auxiliary electrode line is electrically connected with the shielding electrode line through the second sub opening, and the shielding electrode line is electrically connected with the common electrode line through the first sub opening.

13. The array substrate according to claim 1, wherein the color filter opening comprises a slit part between an edge of the color filter opening and the at least two openings, and an orthographic projection of the slit part on the substrate falls within an orthographic projection of the pad layer on the substrate.

14. A display panel, comprising:
    an array substrate;
    an opposite substrate, disposed opposite to the array substrate; and
    a liquid crystal layer, disposed between the array substrate and the opposite substrate;
    wherein the array substrate comprises:
    a substrate;
    a TFT (thin film transistor) driving layer, disposed on the substrate and comprising at least two metal lines;
    a color filter layer, disposed on the TFT driving layer and comprising a color filter opening, wherein the color filter opening is provided with at least two openings separated; and a common electrode layer, disposed on the color filter layer and comprising two or more electrode lines arranged at intervals and electrically connected with the metal wires through the at least two openings;

wherein the array substrate further comprises a pad layer located between the substrate and the color filter layer, and an orthographic projection of an inner edge of the color filter opening on the substrate falls within an orthographic projection of the pad layer on the substrate.

15. The display panel according to claim 14, wherein the pad layer is disposed in a same layer as any one or more of the at least two metal lines in the TFT driving layer.

16. The display panel according to claim 15, wherein the pad layer is formed by any one or more of the at least two metal lines disposed in the same layer as the pad layer and extends to an outside of the color filter opening.

17. The display panel according to claim 16, wherein the at least two openings comprise a first opening and a second opening, the at least two metal lines comprise a first metal line and a second metal line, and the at least two electrode lines comprise a first electrode line and a second electrode line; the first electrode line is electrically connected with the first metal line through the first opening, and the second electrode line is electrically connected with the second metal line through the second opening; and wherein the pad layer comprises a first pad part and a second pad part, the first pad part is formed by the first metal line extending along the outside of the color filter opening, and the second part is formed by the second metal line extending along the outside of the color filter opening.

18. The display panel according to claim 17, wherein the first metal line and the second metal line are disposed in a same layer.

19. The display panel according to claim 18, wherein the first metal line and the second metal line are disposed in different layers.

20. The display panel according to claim 19, wherein the TFT driving layer comprises a thin film transistor comprising a gate electrode, a source electrode, and a drain electrode;

the first metal layer includes a scanning line, the gate electrode, and a common electrode line arranged at intervals, and the second metal layer is insulated disposed on the first metal layer and comprises a data line, a source electrode, and a drain electrode; and the first electrode line comprises a shielding electrode line electrically connected with the common electrode line through the first opening, and the second electrode line comprises a pixel electrode electrically connected with the drain electrode through the second opening.

* * * * *